Oct. 27, 1970 J. A. HALL ET AL 3,536,934

WIDEBAND AUTOMATIC GAIN CONTROL CIRCUIT

Filed Oct. 25, 1967 2 Sheets-Sheet 1

INVENTORS:
JAMES A. HALL,
HARRY J. PEPPIATT,
BY J. David Blumenfeld
THEIR ATTORNEY.

WIDEBAND AUTOMATIC GAIN CONTROL CIRCUIT

Filed Oct. 25, 1967 2 Sheets-Sheet 2

INVENTORS:
JAMES A. HALL,
HARRY J. PEPPIATT,
BY I. David Blumenfeld
THEIR ATTORNEY.

United States Patent Office 3,536,934
Patented Oct. 27, 1970

3,536,934
WIDEBAND AUTOMATIC GAIN CONTROL CIRCUIT

James Allen Hall and Harry James Peppiatt, Lynchburg, Va., assignors to General Electric Company, a corporation of New York Filed Oct. 25, 1967, Ser. No. 678,048
Int. Cl. H03b 3/02
U.S. Cl. 307—237 4 Claims

ABSTRACT OF THE DISCLOSURE

A wideband, automatic gain control circuit which utilizes a PIN diode as a variable resistance control element in the A.G.C. circuit. An interstage coupling network, consisting of two cascaded, distributed line autotransformers, acts as an impedance-transforming network to vary the load impedance seen by a common base amplifier stage as a function of the A.G.C. signal flowing through the PIN diode. By varying the load impedance of the amplifier stage, the output current is controlled to maintain the amplified signal level constant with varying input signal levels.

This invention relates to a circuit for maintaining the output signal level of a transistor-amplifier substantially constant, and, more particularly, to an automatic gain control (A.G.C.) circuit in which wideband control is provided without varying the operating characteristic of the transistor-amplifier and introducing distortion and other undesirable effects.

Control circuits for maintaining the output signal level from an amplifier stage constant with varying input signal levels are old and well known, and are usually referred to as Automatic Gain Control (A.G.C.) Circuits. Typically, such circuits include suitable means for producing a unidirectional control voltage or current which is proportional to the signal level. The control voltage or current is fed back to the amplifier stage to vary the gain in such a manner as to maintain the output signal level constant, even though the input signal level varies widely. Feeding back a unidirectional voltage or current to the transistor to effect this control can, however, introduce difficulties because by doing so the operating point of the transistor is changed, a condition which can introduce nonlinearities, distortion, and various other undesirable effects. Consequently, a need exists for an automatic gain control circuit arrangement in which these effects are not present, and in which the gain control is achieved without in any way varying or changing the DC operating point of the transistor device.

It is, therefore, a primary objective of the instant invention to provide an improved transistor automatic gain control system effective over a wide operating range without introducing distortion or other undesirable effects through the gain control action.

In addition, in automatic gain control circuits for wideband amplifiers at RF frequencies, it is not only necessary that the output level is controlled over a wide range of input signal levels, but it is also vital that the A.G.C. circuit control the signal level very closely over the entire frequency range in order to minimize envelope delay over the desired frequency band.

It is, therefore, a further object of this invention to provide an automatic gain control circuit for a wideband amplifier in which envelope delay and other distortions are minimized, and the output level over the entire frequency band is closely controlled.

Other objects and advantages of the invention will become apparent as the description thereof proceeds.

The various objectives and advantages of the instant invention are realized by providing an automatic gain control circuit in which the gain control element included in the A.G.C. feedback loop includes a PIN diode. The RF resistance of the PIN diode may be varied over a large range of resistance values by varying the DC control current through the diode, which control current is supplied from a suitable A.G.C. detector and amplifier stage. The control circuit, including the PIN diode, is coupled to the output of the transistor-amplifier stage through a wideband, impedance-transforming, interstage coupling network to vary the output loading on the transistor-amplifier stage in response to the A.G.C. control current. This, in turn, controls the level of the output signal current from the amplifier stage so that the output signal level is constant with varying input signal levels.

The novel features which are characteristic of this invention are set forth with particularity in the appended claims. The invention, itself, however, both as to its organization and method of operation, together with further objectives and advantages thereof, may best be understood by reference to the following description taken in connection with the accompanying drawings in which:

Figure 1:
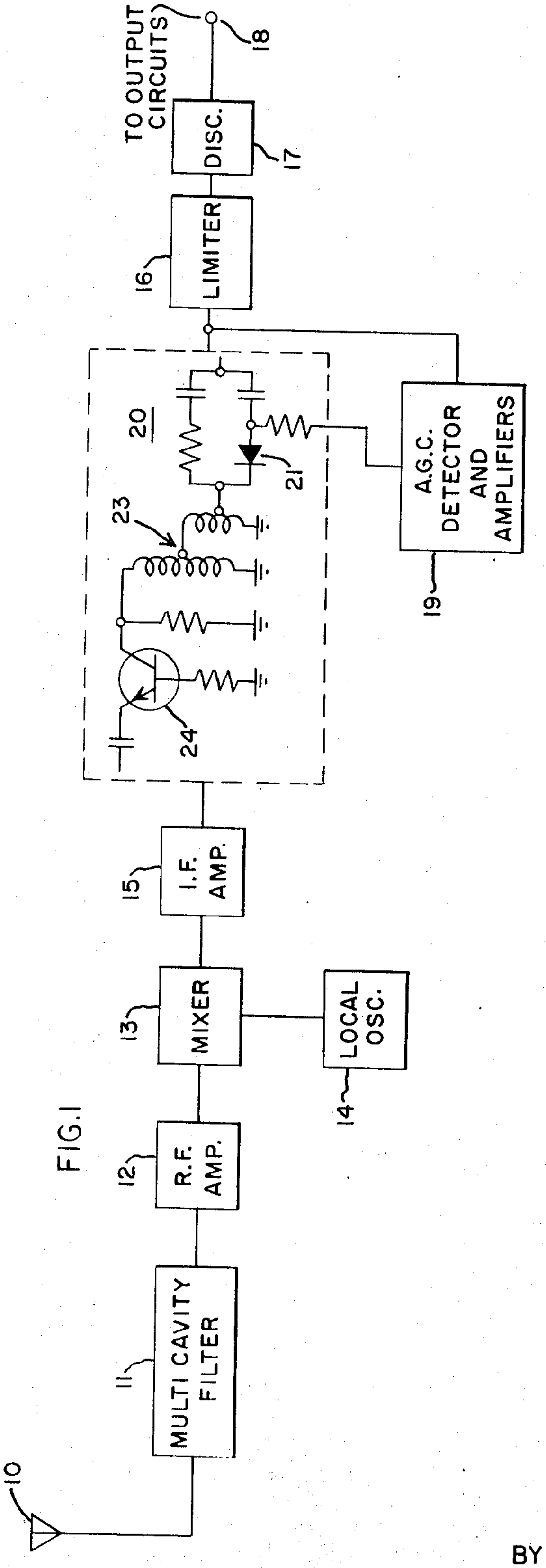
FIG. 1 is a block diagram of the front end of a radio receiver incorporating the invention.

FIG. 1 is a fragmentary block diagram of a radio frequency receiver incorporating an automatic gain control system constructed in accordance with the instant invention. An antenna 10 is coupled to a multi-cavity waveguide filter 11, which filters the received signal and rejects all signals but the one to which the receiver is tuned. The output from the multi-cavity filter may be amplified in one or more RF-amplifying stages 12 and fed to mixer 13. The amplified signal is mixed or heterodyned with a signal from a local oscillator 14 to produce an intermediate frequency (I.F.) output signal which, though lower in frequency than the incoming signal, may still be in the radio frequency range. The I.F. signal is applied to and amplified in one or more intermediate frequency amplifiers shown generally at 15. Although only two stages are shown, it will be obvious that the receiver may contain as many I.F. amplifier stages as are desired in light of the overall system gain requirements. The output from I.F. stage 15 is applied to a limiter 16, and to discriminator 17, to extract the intelligence from the signal. The detected intelligence at terminal 18 may then be coupled to any suitable utilization circuit, such as audio or video stages, etc.

The output signal from I.F. stage 15 is also coupled to an A.G.C. loop, which includes a detector and amplifier stage 19, to produce a unidirectional control current (or voltage) which is a function of the signal level. This unidirectional current (or voltage) is applied to a variable resistance A.G.C. control circuit 20 incorporated in the amplifier stage. The control current flows through PIN diode control element 21 to vary the resistance of the diode and the control circuit. An interstage coupling network 23 between A.G.C. control network 20 and the output of a transistor-amplifying stage 24 functions as an impedance-transforming network for varying the load impedance seen by the transistor amplifier as a function of the automatic gain control current. By varying the reflected impedance seen at the output of the transistor-amplifying stage, the amount of current flowing through the transformers and appearing at the output of amplifier stage 15 may be controlled to maintain the output signal level constant.

Figure 2:
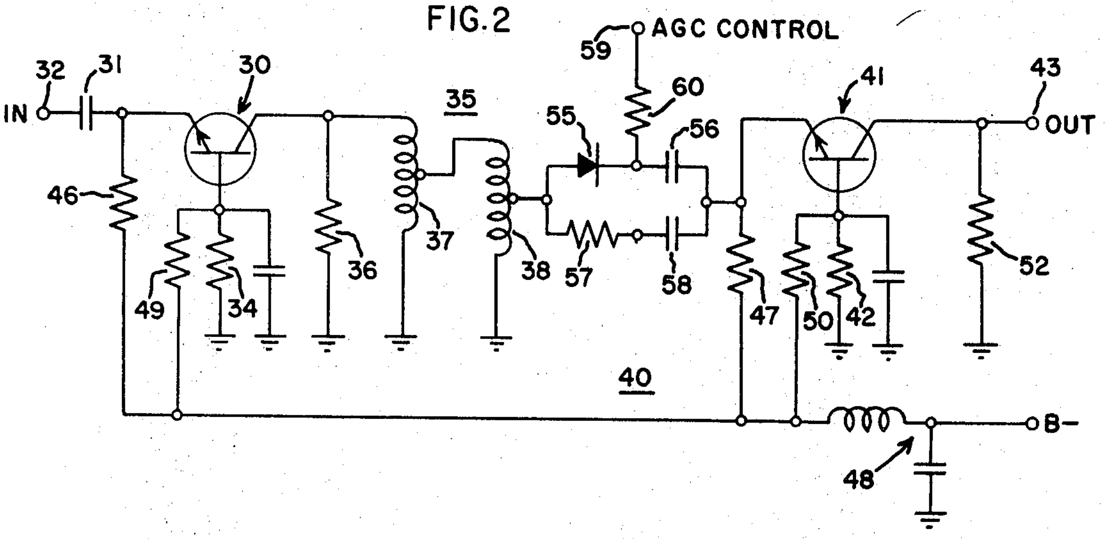
FIG. 2 is a schematic diagram of an amplifier stage including the automatic gain control system of the invention.

FIG. 2 is a circuit diagram of an I.F. amplifier stage incorporating the novel automatic gain control circuitry. The amplifier stage includes an NPN transistor 30 connected in the common base configuration with its emitter connected through a coupling capacitor 31 to a signal input terminal 32. The base is connected to ground through a base resistor and bypass capacitor combination 34, and the collector is connected both to an interstage coupling network, shown generally at 35, and to a load current-shunting resistor 36. Interstage coupling network 35 consists of two cascaded, distributed-line, autotransformers 37 and 38. The two transformers step up the collector current from transistor 30 by a fixed ratio. They also transform the impedance of A.G.C. control network 40 to vary the collector output load, and to control the current (and power) gain by shunting more or less of the transistor collector current through resistor 36 to ground.

The portion of the collector current flowing into network 35 is stepped up by a factor of 4 and is applied through automatic gain control circuit 40 to the emitter of a further I.F. amplifier stage 41. I.F. amplifier stage 41 is similar to stage 30 and includes an NPN transistor connected in the common base configuration, with the base electrode connected to ground through a base resistor and by-pass capacitor combination 42. The collector is connected to an output terminal 43, which may be coupled to further I.F. stages, or the input of a limiter in the receiver.

Operating potential for transistors 30 and 41 is supplied from a source of supply voltage shown generally at B—. The emitters of transistors 30 and 41 are connected to the negative B— terminal through resistors 46 and 47, and filter 48, so that the emitters of these transistors are substantially at B—. The bases of the transistors are maintained at a potential wihch is positive with respect to the emitters by means of voltage dividers (consisting of resistors 34 and 49 in the case of transistor 30, and 50 and 42 in the case of transistor 41), connected between the B— terminal and ground. The bases of the transistors are connected to the junction of these voltage dividers so that the base is maintained at a potential which is more positive than that of the emitter, thereby forward-biasing the base emitter-junctions.

Interstage coupling network 35 consists of two cascaded distributed line autotransformers 37 and 38, each having a two-to-one turns ratio between the primary and secondary. The cascaded autotransformers provide an overall output current transformation of four to one, so that collector current from amplifier 30 which flows into the primary of transformer 37 is stepped up four times. Since common base transistors have a current gain ($\alpha$) of approximately unity, the current gain of the transistor-amplifier is equal to the current transformation provided by the interstage network. While the maximum possible current gain of the stage is thus 4, in actual practice the current gains somewhere between 3 and 4 due to losses in interstage coupling network 35, resistor 36, and A.G.C. network 40.

Transformers 37 and 38 are specially constructed as distributed line transformer (D.L.T.'s) in order to provide wideband characteritics and a substantially flat frequency response over a bandwidth of at least two decades. In wideband amplifiers, amplification of signals having bandwidths of 10 megacycles or more are not uncommon.

Conventional transformers cannot be used because the interwinding capacity of a conventional transformer resonates with the leakage inductance producing loss peaks in the transformer. The high-frequency response of such conventional transformers is thus severely limited. Distributed line transformers, on the other hand, are characterized by an extended high-frequency response resulting in very broadband performance. Distributed line transformers are so constructed that the interwinding capacity becomes part of the characteristic impedance of a non-resonant transmission line which does not resonate to limit the bandwidth of the device. Similarly, the windings can be closely spaced to obtain tight coupling without limiting the bandwidth response. Typically, twin leads encased in any suitable insulating material, are wound as a pair over a core, which may be toroidal or of any other suitable shape, to form a transmission line. The interwinding capacity, as pointed out previously, which limits the response of normal transformers, now forms part of the distributed parameters of the transmission line and has little effect on the high-frequency response. As long as the source and load impedances presented to the distributed line transformers are of the same order of magnitude as the characteristic impedance $Z_0$ of the line, D.L.T.'s operate effectively without having the usual frequency and bandwidth limitations of transformers. For a more thorough discussion of the characteristics, advantages, benefits of distributed line transformers, reference is hereby made to the article entitled "Broadband Transformers," by C. L. Ruthroff, Proceedings of the IRE, Volume 47, No. 8, August 1959, pages 1337–1342.

The output current level is maintained constant by varying the portion of the collector current which flows through shunting resistor 36 to ground. A.G.C. control circuit 40 controls the impedance reflected back by interstage coupling network 35 in such a manner that the division of collector current between resistor 36 and the transformers 37 and 38 may be varied to control the level of the output signal. It will be appreciated that due to the four-to-one turns ratio between the primaries and secondaries of autotransformers 37 and 38, an impedance transformation ratio of 16-to-1 (the square of the turns ratio) is also effected. Any variation in the resistance of control network 40 is thus reflected back and varies the load impedance presented to transistor 30 by the transformers. The division of the output collector current between the coupling network and resistor 36 is correspondingly varied, thereby controlling the magnitude of the output current from the transistor stage 41.

A.G.C. control circuit 40 consists of the combination of a PIN diode 55 and D.C. blocking capacitor 56, connected in parallel with fixed resistor 57 and blocking capacitor 58. The unidirectional A.G.C. control current appearing at input terminal 59 is coupled through a resistor 60 to the junction of PIN diode 55 and capacitor 56. The current flows through diode 55 and thence to ground through the secondary winding of transformer 38. A.G.C. control circuit 40 is connected between the center tap on transformer 38 and the emitter of transistor 41.

PIN diode 55 is a double-diffused PN junction diode which includes an I or intrinsic, high-resistivity, semiconductor layer between the P and N layers. Such PIN diodes are characterized by a very long minority carrier lifetime. At higher frequencies, usually above one megahertz (the exact frequency level depending on the thickness of the intrinsic layer), the diode is an extremely poor rectifier when forward-biased and acts, in essence, as a linear variable resistor, with the resistance varying inversely with the D.C. bias current. Thus at zero or negative D.C. bias, the intrinsic layer has a very high resistivity and the resistance is in the order of thousands of ohms. At moderately large forward-bias currents, on the other hand, the resistance drops to a very low value in the order of one or two ohms. The diode thus functions as a linear variable resistance with varying forward-bias current.

PIN diodes are also characterized by the fact that R.F. signal currents much greater than the D.C. bias current can be conducted through the diode with very low distortion with the ratio of D.C.-to-R.F. current for a given distortion being dependent upon the frequency and the diode minority carrier lifetime. For a further and more detailed description of the operating characteristics of PIN diodes, reference is hereby made to the article entitled "The Potential of Semiconductor Diodes in High-Frequency Communications," Proceedings of the IRE, Volume 46, pages 1099, et seq, in particular, Section VI, entitled "PIN Diodes," pages 1106 et seq.

The A.G.C. control current for PIN diode 55 is, of course, supplied from the A.G.C. loop over terminal 59 and resistor 60. Capacitors 56 and 58 block the D.C. current but permit the amplified signal to pass through. Resistor 57 limits the resistance of the control circuit when PIN diode is in its high-resistance state to approximately the resistance of resistor 57. With PIN diode 55 in its low-resistance state (i.e., its resistance drops to one or two ohms), PIN diode 55 establishes the resistance of the network. Between zero and maximum D.C. bias current, the resistance varies to control the resistance of the circuit and, hence, the transformed resistance seen by the collector of transistor 30.

With maximum D.C. current( approximately 10 milliamps) flowing through the diode, the R.F. resistance is only one or two ohms. The resistance presented to impedance-transforming network 35 is, therefore, equal to the sum of the resistance of the PIN diode, and the input resistance of the common-base transistor stage 41. Since the input resistance $R_e$ of a common-base transistor stage is defined generally by the formula $$R_e \approx \frac{26}{I_e(\text{ma.})}$$

the emitter-resistance of the transistor stage (for a typical emitter current $I_e$=4–5 ma.) is only about four or five ohms. Hence, the total resistance seen by network 35 is approximately five or six ohms. Through the impedance-transforming action of network 35, the load presented by this network to the collector of transistor 30 is approximately 100 ohms (i.e., 6 ohms×16, the impedance-transforming ratio of the network). The resistance of resistor 36 is much larger than 100 ohms (900Ω, for example), so that the portion of the output collector current flowing into resistor 36 is very small compared to that flowing into the transformer 37 of coupling network 35. The current gain of the *total* interstage network is, therefore, high—just a little over 3 (i.e., Ω10 db); the reduction in gain being due to the losses in the transformer and that fraction of the signal current flowing through resistor 36.

At the opposite end of the control range, when the D.C. current flowing through PIN diode 55 goes to zero, the resistance of the diode is thousands of ohms. Resistor 57 limits the maximum resistance of the parallel combination to a value, for example, of 80–100 ohms or so. The load presented by the impedance-transforming coupling network to the collector of transistor 30 is quite high (approximately 1400–1600 ohms; i.e., 80–100×16), and a large part of the signal current flows into resistor 36 since the load impedance presented by the transforming network is now substantially larger than the resistance of resistor 36. The resulting net current gain of the interstage coupling network at this end of the control range is approximately one, that is—only a small fraction of the output collector current flows in transformer 37 to be stepped by a ratio of 4-to-1 to provide a net current gain for this condition of about 1. By thus varying the D.C. current through PIN diode 55 as a function of the output signal level, the current gain of the amplifier stage can be varied by a factor of approximately 3 (i.e., 10 db), thereby providing a linear A.G.C. control over a wide range of values.

It can be seen, therefore, that if the input signal level varies in a direction such as to increase the output signal level, the A.G.C. loop operates to reduce the control current to the PIN diode. Reduction of the diode current increases the resistance of the diode and of the control circuit. The transformed impedance presented to the transistor by the interstage network increased the load impedance sufficiently to reduce the collector current flowing into the network sufficiently to bring the output signal to the desired level even though the input signal level has increased. Similarly, if the input signa level decreases, tending thereby to decrease the output signal, the A.G.C. control current flowing through the PIN diode increases. The resistance of the diode and the control circuit decreases as does the load impedance which the interstage coupling network presents to the transistor. The portion of the collector current now flowing into the network increases and is stepped up therein to maintain the output signal level.

As pointed out previously, one of the major advantages of using a PIN diode as the control element in the A.G.C. control network is that the resistance of the PIN diode is linear over the range because of the poor rectification characteristics of such a diode due to a large minority carrier lifetime. A PIN diode, unlike a regular PN junction diode, can be considered as a simple, voltage-variable resistance element, and unlike a PN junction has no reactance components which also vary with the D.C. control current. That is, with a regular PN diode, not only is the conductivity varied, but a junction capacity exists across the PN junction which varies with applied voltage. This varying capacitive reactance is undesirable in a wideband amplifier network because it introduces resonance so that the gain over the entire band is not constant, but varies with frequency, thereby producing envelope delay distortion of the amplified signal.

Figure 3:
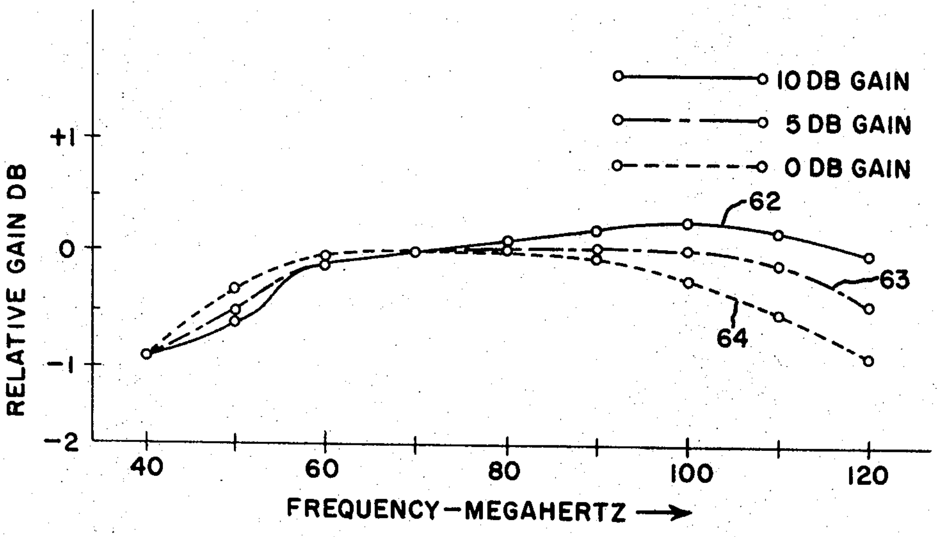
FIG. 3 is a graph illustrating the frequency response of an amplifier incorporating the automatic gain control circuit of the instant invention.

To illustrate how the instant automatic gain control circuit minimizes envelope delay in that the relative gain of the amplifier stage remains virtually constant over a wide frequency band, the relative gain vs. frequency characteristics of an A.G.C. control network having a 10 db range were measured. The results are plotted in FIG. 3, in which the relative gain in db is plotted along the ordinate and the frequency is plotted along the abscissa. Three curves—62, 63, and 64, representing respectively the 10-db, 5-db, and 0-db gain curves (i.e., the two extremes of the A.G.C. range, as well as an intermediate condition) were plotted over a frequency range extending from 40 megahertz to 120 megahertz. In this instance, it was desired to know the effectiveness of the circuit arrangement for a 70 megahertz I.F. amplifier constructed to pass a signal of 70 megahertz±10 megahertz.

It may be noted that over the range of interest from 60 to 80 megahertz, the variation in the relative gain is less than 1/10 db for the full 10-db A.G.C. range. It will be obvious to those skilled in the art that, in addition to maintaining a very close automatic gain control level, envelope delay over the full 10-db A.G.C. range for a 20 megahertz band is very small. This illustrates that the automatic gain control arrangement of the instant invention is not only effective to control the output signal level closely over a wide frequency range, but that it will do so without introducing phase or envelope delay.

In this application, the input circuit and capacitor 31 are not critical due to the extremely low input Z of 30.

An amplifier stage in accordance with the invention was constructed to have a 20 megahertz passband centered at 70 mHz, and to have less than 0.1 db variation in output level with a 10-db variation in input level. The component values for the amplifier and A.G.C. network were as follows:

| | |
|---|---|
| Transistor **30** | Silicon NPN Type 2N918. |
| Transistor **41** | Silicon NPN Type 2N918. |
| PIN Diode **55** | HPA3001. |
| $C_{31}$ | .01 $\mu$f. |
| $C_{34}$ | .01 $\mu$f. |
| $C_{42}$ | .01 $\mu$f. |
| $C_{56}$ | .01 $\mu$f. |
| $C_{58}$ | .01 $\mu$f. |
| $R_{34}$ | 6.8K ohms. |
| $R_{36}$ | 910 ohms. |
| $R_{42}$ | 6.8K ohms. |
| $R_{46}$ | 10.0K ohms. |
| $R_{47}$ | 10.0K ohms. |
| $R_{49}$ | 10.0K ohms. |
| $R_{50}$ | 10.0K ohms. |
| $R_{52}$ | 910 ohms. |
| $R_{57}$ | 82 ohms. |
| $R_{60}$ | 2.4K ohms. |
| $L_{48}$ | 3.3 microhenries. |
| DLT | 4 turns of bifilar wire wound on a small ferrite toroid (Indiana General CF101 core material). |

It will now be apparent from the description which has preceded that the instant invention provides an automatic gain control circuit for a transistor amplifier which is characterized by the fact that very excellent linear, wide-range control of the signal level may be achived. Furthermore, the A.G.C. circuit is effective over a wide band of frequency without introducing deleterious effects such as phase or envelope delay, etc.

While a particular embodiment of this invention has been described and shown, it will, of course, be understood that it is not limited thereto, since many modifications and variations in the method and the circuit arrangement and in the instrumentalities for carrying out the invention may be made.

What is claimed as new and desired to be secured by United States Letters Patent is:

1. An improved automatic gain control circuit for use with an amplifier having at least one transistor connected in a common base configuration and having a coupling network connected to the output terminals of said transistor, said automatic gain control circuit comprising:

(a) a first circuit having a first resistor and a first capacitor connected in series;

(b) a second circuit having a PIN diode and a second capacitor connected in series;

(c) means connecting said first and second circuits in parallel between first and second terminals;

(d) means for connecting said first terminal to said coupling network;

(e) means connected to said second terminal for deriving an output signal therefrom;

(f) and means connected to said PIN diode for supplying direct current thereto, said direct current varying as a function of said output signal so as to vary the conductivity of said PIN diode and hence the gain of said amplifier.

2. The improved automatic gain control circuit of claim 1, and further comprising a third resistor connected to the junction of said first resistor and said first capacitor for connection to said coupling network.

3. The improved automatic gain control circuit of claim 1 wherein said means for supplying direct current to said PIN diode are connected to the junction of said PIN diode and said second capacitor.

4. The improved automatic gain control circuit of claim 1, and further comprising a third resistor connected to the junction of said first resistor and said first capacitor for connection to said coupling network, and wherein said means for supplying direct current to said PIN diode are connected to the junction of said PIN diode and said second capacitor.

References Cited

UNITED STATES PATENTS

| | | | |
|---|---|---|---|
| 2,964,651 | 12/1960 | Thomas | 307—235 |
| 3,011,066 | 11/1961 | Vogelsong | 307—237 XR |
| 3,417,340 | 12/1968 | Overtveld | 330—29 XR |

STANLEY T. KRAWCZEWICZ, Primary Examiner

U.S. Cl. X.R.

328—175; 330—29